United States Patent
Hu et al.

(10) Patent No.: US 6,751,850 B2
(45) Date of Patent: Jun. 22, 2004

(54) ASSEMBLY STATION FOR SPUTTER SHIELD ASSEMBLY

(75) Inventors: Wen-Ken Hu, Miaoli (TW); Hsiao-Ping Hsieh, Hsinchu (TW); Zhi-Zhao Tai, Tainan Hsien (TW); Mark Wang, Kaohsiung (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 10/006,224

(22) Filed: Dec. 10, 2001

(65) Prior Publication Data

US 2002/0108567 A1 Aug. 15, 2002

(30) Foreign Application Priority Data

Feb. 14, 2001 (TW) ..................... 90202234 U

(51) Int. Cl.⁷ ..................... B23P 19/00; B25B 27/14
(52) U.S. Cl. ..................... 29/700; 29/281.1
(58) Field of Search ............... 29/700, 721, 281.1, 29/281.5, 281.6; 204/192.1, 298.11; 156/916

(56) References Cited

U.S. PATENT DOCUMENTS 5,690,795 A * 11/1997 Rosenstein et al. ...... 204/192.1

* cited by examiner

*Primary Examiner*—John C. Hong
(74) *Attorney, Agent, or Firm*—Troxell Law Office PLLC

(57) ABSTRACT

An assembly station for a sputter shield assembly provides a work bench for assembling and disassembling the sputter shield assembly. The shield assembly has a clamp shield facing downwards to hold the shield assembly which is turned over by 180 degrees, and includes at least three bottom rim support arms for supporting the clamp shield and bearing the weight of the shield assembly, and at least three inner rim retaining arms for contacting the inner rim formed by the shield and the clamp shield. The invention provides a changed support means for holding the shield assembly on the assembly station so that one person is enough to do the assembly and disassembly of the shield assembly, and thus save manpower and operation time.

9 Claims, 2 Drawing Sheets

ASSEMBLY STATION FOR SPUTTER SHIELD ASSEMBLY

BACKGROUND OF THE INVENTION (1) Field of the Invention

The present invention relates to an assembly station for sputter shield assembly and more particularly to an assembly station that provides a new shield assembly support method for allowing the shield assembly assembling and disassembling to be done by a single person.

(2) Description of the Prior Art

A conventional sputter (such as an Applied Endura 5500) generally includes a shield assembly to fend off the sputtering particles. FIG. 1 shows a conventional shield assembly which consists of an adapter 1, a shield 2 mounted to the adapter 1, a clamp shield 3 to clip the shield 2 onto the adapter 1, and a plurality of fastening screws 4. When use in operation, the shield assembly usually is disposed like what is shown in FIG. 1, i.e. with the shield 2 facing downwards through a center opening 100 of the adapter 1 and having the fastening screws 4 engaging, from bottom to top, the adapter 1, the shield 2 and the clamp shield 3 through respective screws bores 10, 20 and 30 formed respectively in the adapter 1, the shield 2 and the clamp shield 3. Then, through the adapter 1 and the clamp shield 3, the shield 2 can be fastened to an upper rim of the adapter 1 (adjacent to the inner rim of the center opening 100).

Whenever the reaction chamber of the sputter is undergoing regular maintenance in order to prevent dust or particles resided on the used shield 2 from becoming a source for contamination or pollution, the shield 2 is generally being replaced. Referring to FIG. 2, when to replace the shield 2, the shield assembly usually has to be turned upside down 180 degrees and mounted to a work bench 5 provided by manufacturers. The work bench 5 has a plurality of support arms 51 to support the adapter 1. During dismantling the shield assembly, one engineer disengages the fastening screws 4, and another engineer holds the clamp shield 3 and the shield 2 of the overturned shield assembly to prevent the clamp shield 3 and the shield 2 from dropping when the fastening screws 4 are loosened, or to prevent the screw threads of the screw bore 30 of the clamp shield 3 from damaging from the unbalanced loosening screws 4. Once the fastening screws 4 have been unfastened and removed, the clamp shield 3 and the shield 2 may be removed from the work bench 5.

To assemble the shield assembly, as the fastening screws 4 are engaged to the back side of the adapter 1 (the upper side shown in FIG. 2) and run through the shield 2 and the clamp shield 3, it still requires two engineers to do the work. One engineer fastens the screws 4, while another engineer holds both the clamps shield 3 and the shield 2, aligns the screw bores 10, 20, 30, and calibrates the direction of the edges of the shield 2. The work of alignment and calibration is tedious and takes a lot of time. Hence, replacement (especially the assembly) of the shield 2 often becomes a bottleneck in the regular maintenance processes and results in waste of manpower and time.

SUMMARY OF THE INVENTION

Accordingly, it is the primary object of the invention is to provide an assembly station for sputter shield assembly that changes shield assembly support method on the work bench to allow assembly and disassembly of the shield assembly performed by a single person to save manpower and time.

The assembly station for sputter shield assembly of the invention offers a work bench to facilitate assembling and disassembling of the shield assembly. The shield assembly includes, according to a stacking sequence, a hollow adapter, a hollow shield mounting to the hollow portion of the adapter, and a hollow clamp shield. The shield assembly further has a center line running through the adapter, the shield and the clamp shield. The shield and the clamp shield together form an inner rim when assembled. The shield assembly is mounted to the assembly station with the clamp shield facing downwards, and includes at least three bottom rim support arms and at least three inner rim retaining arms.

The bottom rim support arms support the clamp shield and bear the weight of the shield assembly. Preferably, at least three of the bottom rim support arms can form a pseudo acute triangle surrounding the center line of the shield assembly.

The inner rim retaining arms contact the inner rim formed by the shield and the clamp shield. In a preferred embodiment, at least three of the inner rim retaining arms can form a pseudo acute triangle surrounding the center line of the shield assembly.

In one embodiment of the invention, the bottom rim support arms can be connected to form an annular structure.

In one embodiment of the invention, the inner rim retaining arms can be formed by extending respectively the bottom rim support arms.

In one embodiment of the invention, the inner rim retaining arms can be connected to form an annular structure.

In one embodiment of the invention, the assembly station can include at least three adapter jutting support rims to contact the adapter of the shield assembly for complementing the bottom rim support arms that support the weight of the shield assembly. The adapter jutting support rims may form a pseudo acute triangle surrounding the center line of the shield assembly, and may be preferably connected to form an annular structure.

In one embodiment of the invention, the assembly station includes at least three adapter retaining flanges, each having a side wall to contact the adapter for anchoring the shield assembly along the horizontal direction. The adapter retaining flanges may be formed a pseudo acute triangle surrounding the center line of the shield assembly, and may be preferably connected to form an annular structure.

The foregoing, as well as additional objects, features and advantages of the invention will be more readily apparent from the following detailed description, which proceeds with reference to the accompanying drawings.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
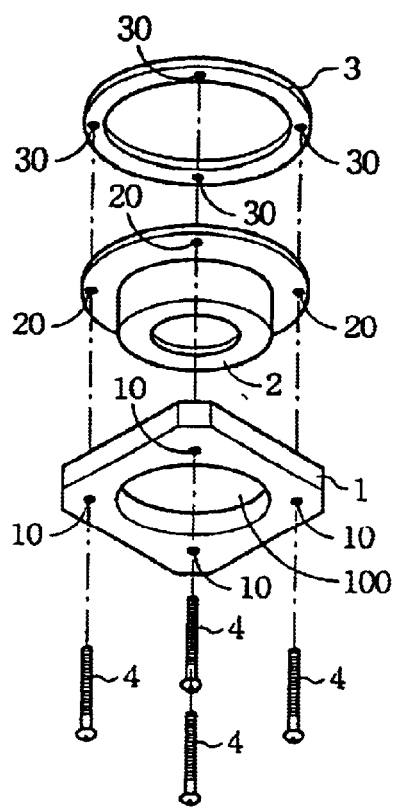
FIG. 1 is an exploded view of a conventional sputter shield assembly.
Figure 2:
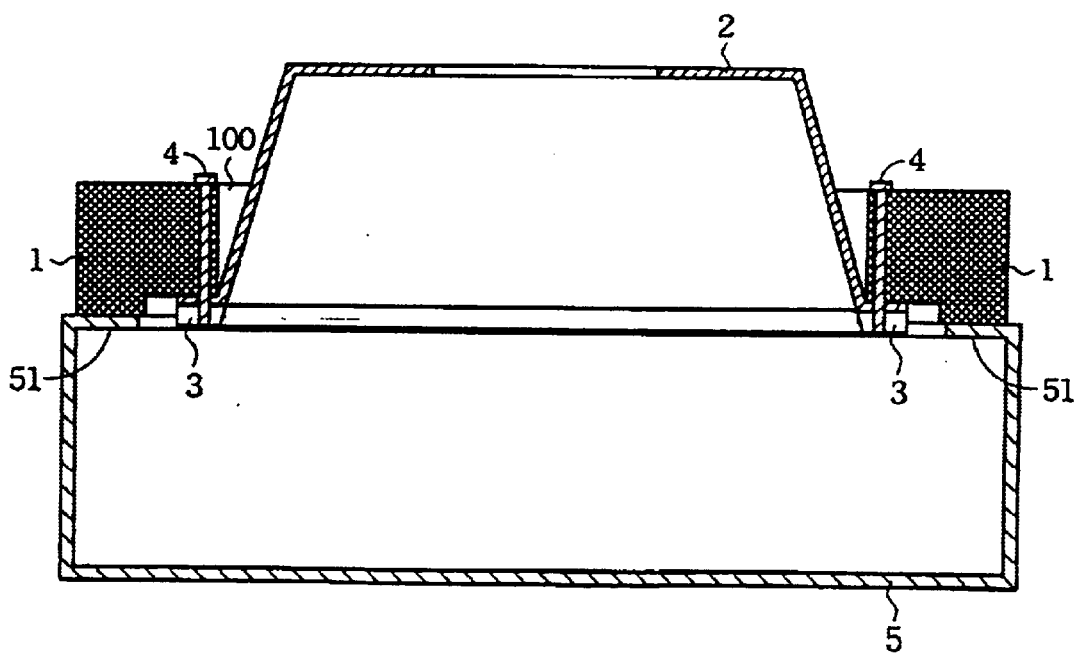
FIG. 2 is a cross-sectional view of a conventional shield assembly and a work bench.

The invention disclosed herein is directed to an assembly station for sputter shield assembly. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

In the discussions below for the embodiments of the invention, elements of same function will be designated by the same names with the same numerals in the drawings.

Figure 3:
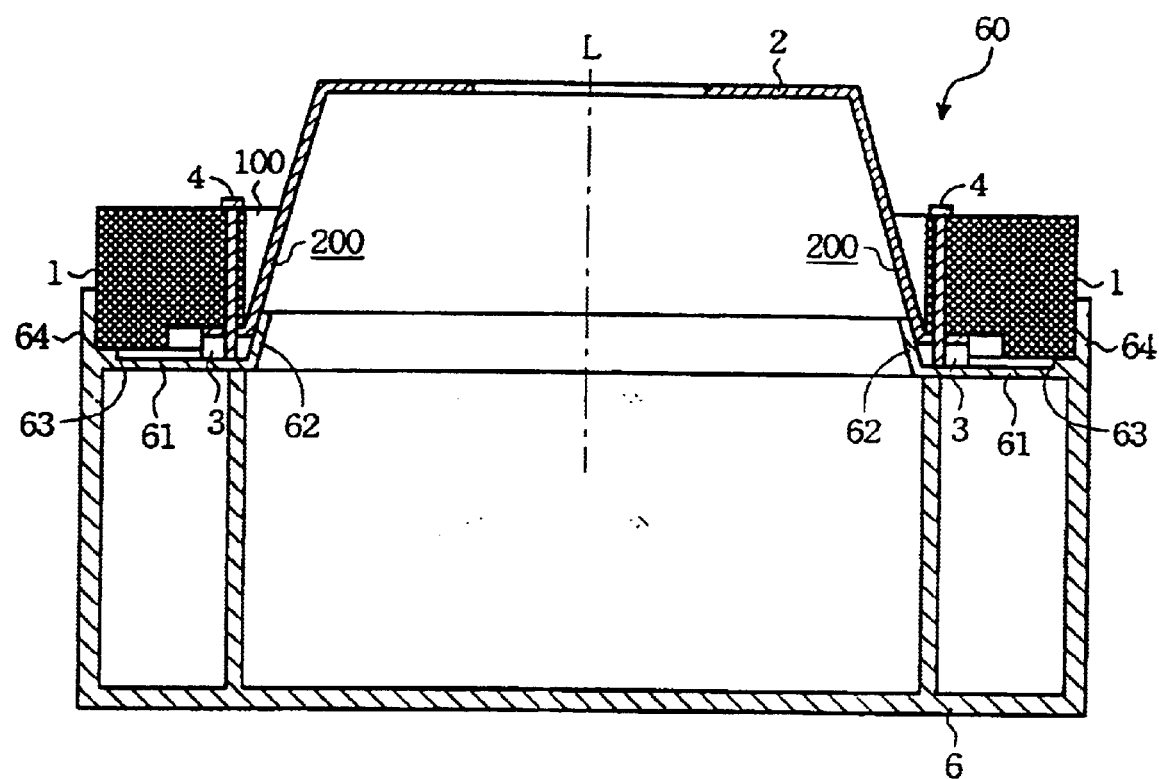
FIG. 3 is a cross-sectional view of a sputter shield assembly and an assembly station in accordance with the invention.

Referring now to FIG. 3 for an embodiment of the invention, the shield assembly is constructed as the conventional one and includes, in a regular stacking sequence, a hollow adapter 1, a hollow shield 2 mounted to the hollow portion of the adapter 1, a hollow clamp shield 3 and a plurality of fastening screws 4 to fasten the three previous elements. The shield assembly further has a center line L running through the hollow adapter 1, the shield 2 and the clamp shield 3. The shield 2 and the clamp shield 3 can form an inner rim 200 when assembled. As shown in the drawing, the shield assembly is turned upside down by 180 degrees and mounted to an assembly station 6 of the invention with the clamp shield 3 facing downwards.

The assembly station 6, performed as a work bench for assembling and disassembling the shield assembly, provides an upper space 60 for mounting the shield assembly, and includes at least three bottom rim support arms 61 and at least three inner rim retaining arms 62. The bottom rim support arms 61 are used to support the clamp shield 3 and to bear the weight of the shield assembly (including both the adapter 1 and the shield 2). In order to support the shield assembly firmly without toppling, the bottom rim support arms 61 can form a pseudo acute triangle surrounding the center line L of the shield assembly. In a preferred embodiment of the invention, the bottom rim support arms 61 are connected to form an annular structure.

The inner rim retaining arms 62 for contacting the inner rim 200 formed by the shield 2 and the clamp shield 3 can provide effective center alignment of the shield assembly during assembly operations. To ensure attaining this end, the preferred arrangement of the inner rim retaining arms 62 are to form a pseudo acute triangle surrounding the center line L of the shield assembly. As shown in the drawing, the inner rim retaining arms 62 may be formed by extending respectively the bottom rim support arms 61. Of course, in another embodiment of the present invention, the inner rim retaining arms 62 may also be formed separately. However, in a preferred embodiment of the invention, the inner rim retaining arms 62 are connected to form an annular structure.

As shown in FIG. 3, the assembly station 6 may also include at least three adapter support jutting rims 63 to contact the adapter 1 when assembling the shield assembly on the assembly station 6 to complement the bottom rim support arms 61 for supporting the weight of the shield assembly. By the same token, in order to support the shield assembly firmly without toppling, the adapter support jutting rims 63 may be formed a pseudo acute triangle surrounding the center line L of the shield assembly. In a preferred embodiment of the invention, the adapter support jutting rims 63 can be connected to form an annular structure.

As shown in FIG. 3, the assembly station 6 may further include at least three adapter retaining flanges 64, each has a side wall to contact the adapter 1 for anchoring the shield assembly in the horizontal direction. To ensure attaining this end, the adapter retaining flanges 64 may be formed a pseudo acute triangle surrounding the center line L. In a preferred embodiment of the invention, the adapter retaining flanges 64 can be connected to form an annular structure.

By means of the assembly station 6 of the invention, when the shield assembly is mounted thereon, the bottom rim support arms 61 supports the clamp shield 3 to facilitate assembling and disassembling of the shield assembly by a single person without incurring dropping of the clamp shield 3 and the shield 2 when the fastening screws 4 are loosened. When the invention is in use, after the fastening screws 4 are loosened, the adapter 1 and the shield 2 may be removed individually from the upper side. This operation is different from the conventional structures which have the weight of the shield assembly levied upon the work bench 5 through the adapter 1 and remove the clamp shield 3 and the shield 2 orderly by loosening the fastening screws 4.

When using the assembly station 6 of the invention to assemble the shield assembly again, the clamp shield 3 and the shield 2 may be anchored and positioned respectively and easily on the assembly station 6 through the inner rim retaining arms 62. Then, the adapter 1 is disposed on the shield 2 for engaging the fastening screws 4. As the assembly station 6 of the invention allows operations performed from top to bottom, so that aligning and fastening of the adapter 1, the shield 2 and the clamp shield 3 are much easier. The assembling operations can be done without the need of holding the shield 2 and clamp shield 3, thus one engineer is enough to do the job of assembling the shield assembly.

Figure 4:
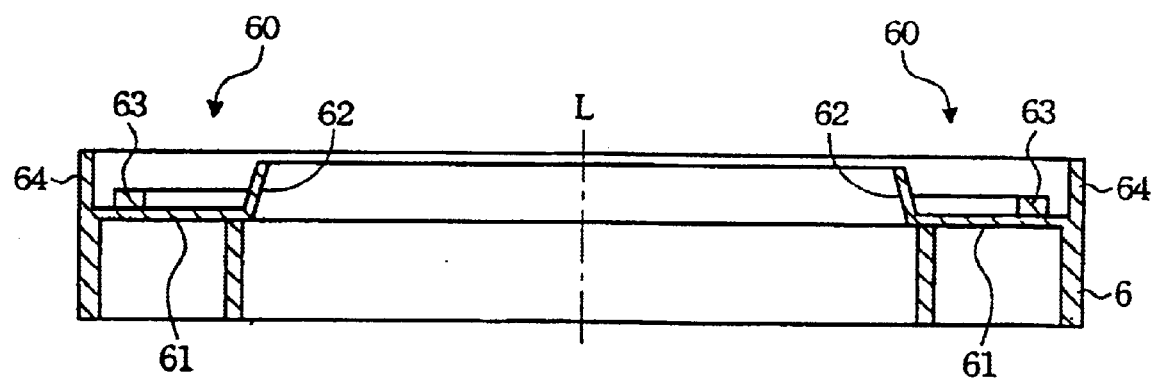
FIG. 4 is a cross-sectional view of another embodiment of the assembly station in accordance with the present invention.

Referring now to FIG. 4 for another embodiment of the invention, the assembly station 6' is largely constructed like the one shown in FIG. 3. The major difference is that the assembly station 6 shown in FIG. 3 is a complete standing station while the assembly station 6' in FIG. 4 is a table top type with a shorter height for resting on a table top or on the conventional work bench 5. Another difference is that the adapter support jutting rims 63 and the adapter retaining flanges 64 in the embodiment of FIG. 3 are integrally formed, while the adapter support jutting rims 63 and the adapter retaining flanges 64 in the embodiment of FIG. 4 are formed separately.

By means of the constructions set forth above, the invention provides a changed support means for holding the shield assembly on the assembly station such that only one person is required to do the assembly and disassembly of the sputter shield assembly, and thus can effectively save manpower and operation time.

While the present invention has been particularly shown and described with reference to a preferred embodiment, it will be understood by those skilled in the art that various changes in form and detail may be without departing from the spirit and scope of the present invention.

We claim:

1. An assembly and disassembly station for a sputter shield including an adapter, a shield having a portion extending through the adapter and a clamp shield clamping the shield to the adapter, the assembly and disassembly station comprising:
   a) an outer wall including an adapter retaining flange;
   b) a first support element having a first support surface in a first plane for supporting the clamp shield thereon;
   c) a second support element having a second support surface in a second plane spaced from the first plane, for supporting the adapter; and,
   d) an inner rim retaining element extending from the first support element so as to contact an inner surface of the shield whereby the station supports all of the elements of the sputter shield during assembly and disassembly of the sputter shield.

2. The assembly and disassembly station of claim 1 further comprising at least three first support elements and at least three second support elements annularly positioned on the assembly and disassembly station.

3. The assembly and disassembly station of claim 1 wherein the first and second support elements have annular configurations.

4. The assembly and disassembly station of claim 3 wherein the inner rim retaining element has an annular configuration.

5. The assembly and disassembly station of claim 4 wherein the inner rim retaining element extends from an inner edge of the first support element.

6. The assembly and disassembly station of claim 1 wherein the adapter retaining flange has an upper edge and wherein the first and second support elements are located below the upper edge.

7. The assembly and disassembly station of claim 1 wherein the first support element extends inwardly from the adapter retaining flange.

8. The assembly and disassembly station of claim 1 wherein the second support element is adjacent to the adapter retaining flange.

9. The assembly and disassembly station of claim 1 wherein the second support element is spaced from the adapter retaining flange.

* * * * *